United States Patent
Shu et al.

(10) Patent No.: US 11,121,047 B2
(45) Date of Patent: Sep. 14, 2021

(54) SEMICONDUCTOR STRUCTURE

(71) Applicant: TAIWAN SEMICONDUCTOR MANUFACTURING CO., LTD., Hsinchu (TW)

(72) Inventors: Cheng-Bo Shu, Tainan (TW); Tsung-Hua Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 42 days.

(21) Appl. No.: 16/353,044

(22) Filed: Mar. 14, 2019

(65) Prior Publication Data

US 2020/0294871 A1     Sep. 17, 2020

(51) Int. Cl.
*H01L 23/58* (2006.01)
*H01L 21/66* (2006.01)
*H01L 23/522* (2006.01)
*H01L 27/02* (2006.01)
*H01L 23/528* (2006.01)
*H01L 21/78* (2006.01)

(52) U.S. Cl.
CPC ............ *H01L 22/34* (2013.01); *H01L 23/528* (2013.01); *H01L 23/5226* (2013.01); *H01L 27/0207* (2013.01); *H01L 21/78* (2013.01); *H01L 22/14* (2013.01)

(58) Field of Classification Search
CPC ... H01L 22/34; H01L 23/5226; H01L 23/528; H01L 27/0207; H01L 22/14; H01L 21/78
USPC .......................................................... 257/48
See application file for complete search history.

(56) References Cited

U.S. PATENT DOCUMENTS

| | | | |
|---|---|---|---|
| 7,482,675 B2* | 1/2009 | Adkisson | H01L 22/32 257/48 |
| 2009/0102059 A1* | 4/2009 | Ishii | H01L 24/05 257/774 |
| 2017/0169153 A1* | 6/2017 | Hwang | H01L 22/34 |

* cited by examiner

*Primary Examiner* — Tan N Tran
(74) *Attorney, Agent, or Firm* — McClure, Qualey & Rodack, LLP

(57) ABSTRACT

A semiconductor structure includes a substrate, a device, a contact via, a metal/dielectric layer, and a test structure. The device is over the substrate. The contact via is connected to the device. The metal/dielectric layer is over the contact via. The metal/dielectric layer includes a first portion and a second portion. The first portion of the metal/dielectric layer has a metallization pattern connected to the contact via. The second portion of the metal/dielectric layer is void of metal. The test structure is over the second portion of the metal/dielectric layer.

20 Claims, 11 Drawing Sheets

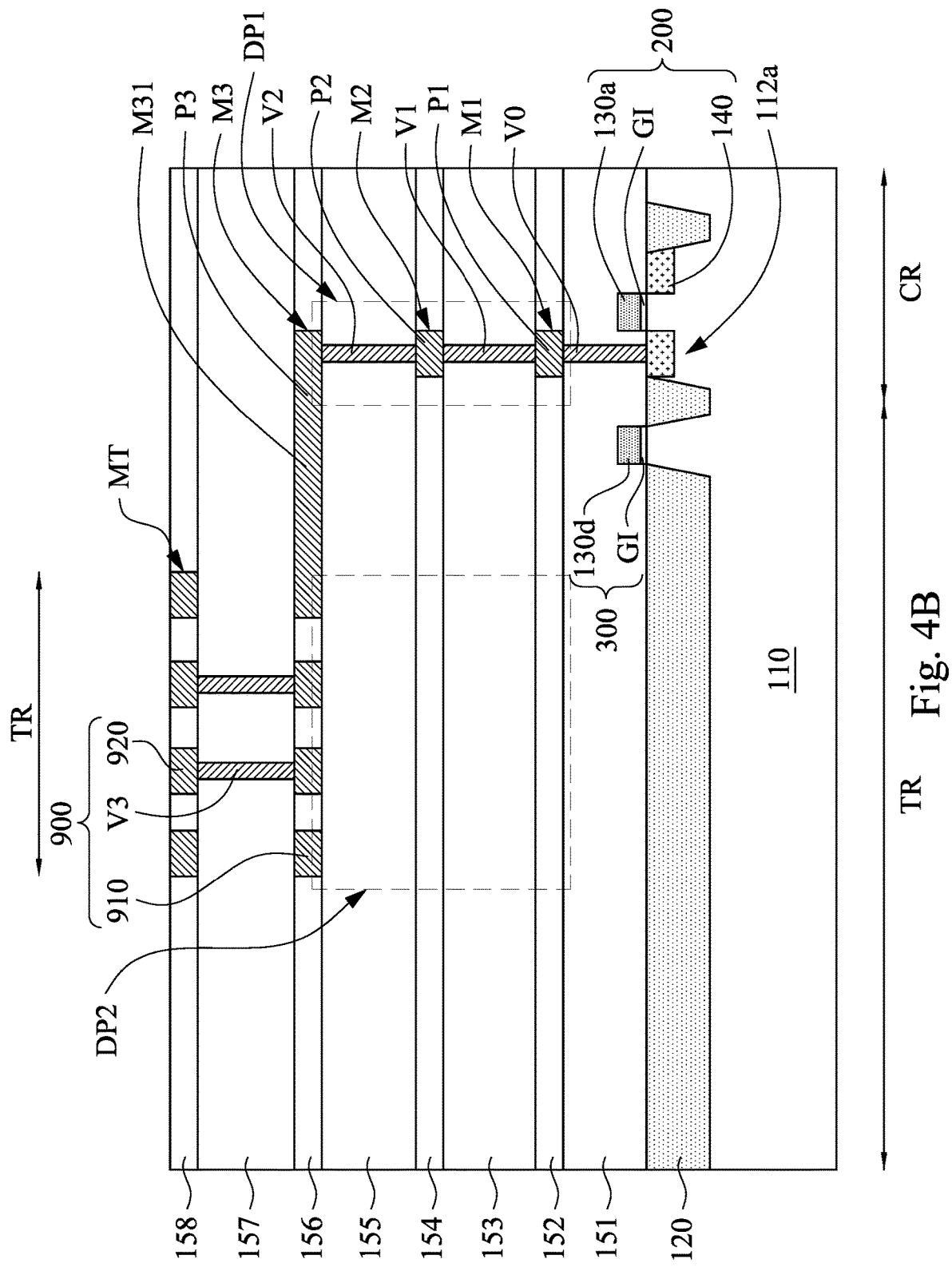

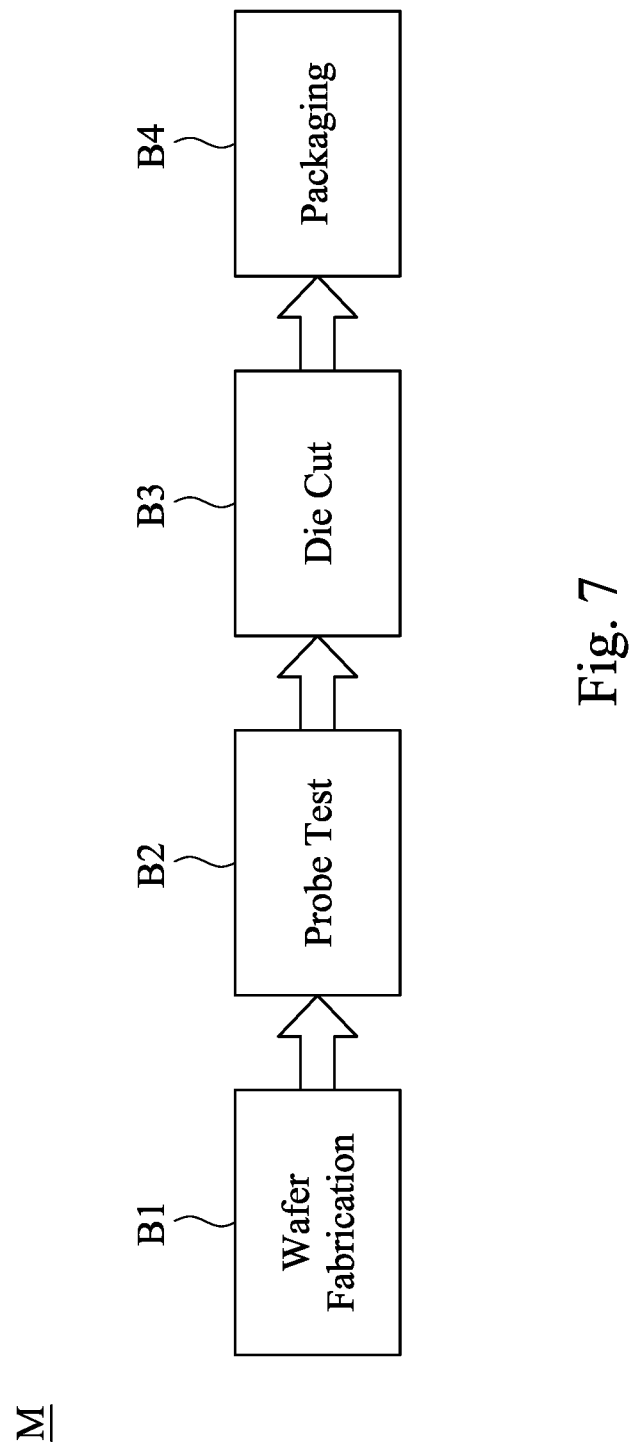

SEMICONDUCTOR STRUCTURE

BACKGROUND

Semiconductor chips are small electronic devices that are used in a wide range of applications such as personal computers, cellular telephones, and gaming devices. Each chip is actually a small piece of semiconductor material onto which have been fabricated a large number of integrated circuits. Each integrated circuit, in turn, includes a number of tiny electronic components that are interconnected together. A semiconductor is a material that when properly prepared is capable of conducting electricity under certain controllable conditions, such as the application of the small electrical charge. Each of the small components in an integrated circuit is fabricated using successive layers of semiconductor, insulating, and conducting materials arranged in a certain fashion. After the fabrication, a test using one or more probes is conducted to determine which components are good and which are not.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4B is a cross-schematic view of the semiconductor structure of FIG. 4A.

FIG. 7 is a flow chart of a method for manufacturing an integrated circuit according to some embodiments of the present disclosure.

DETAILED DESCRIPTION

Figure 1A:
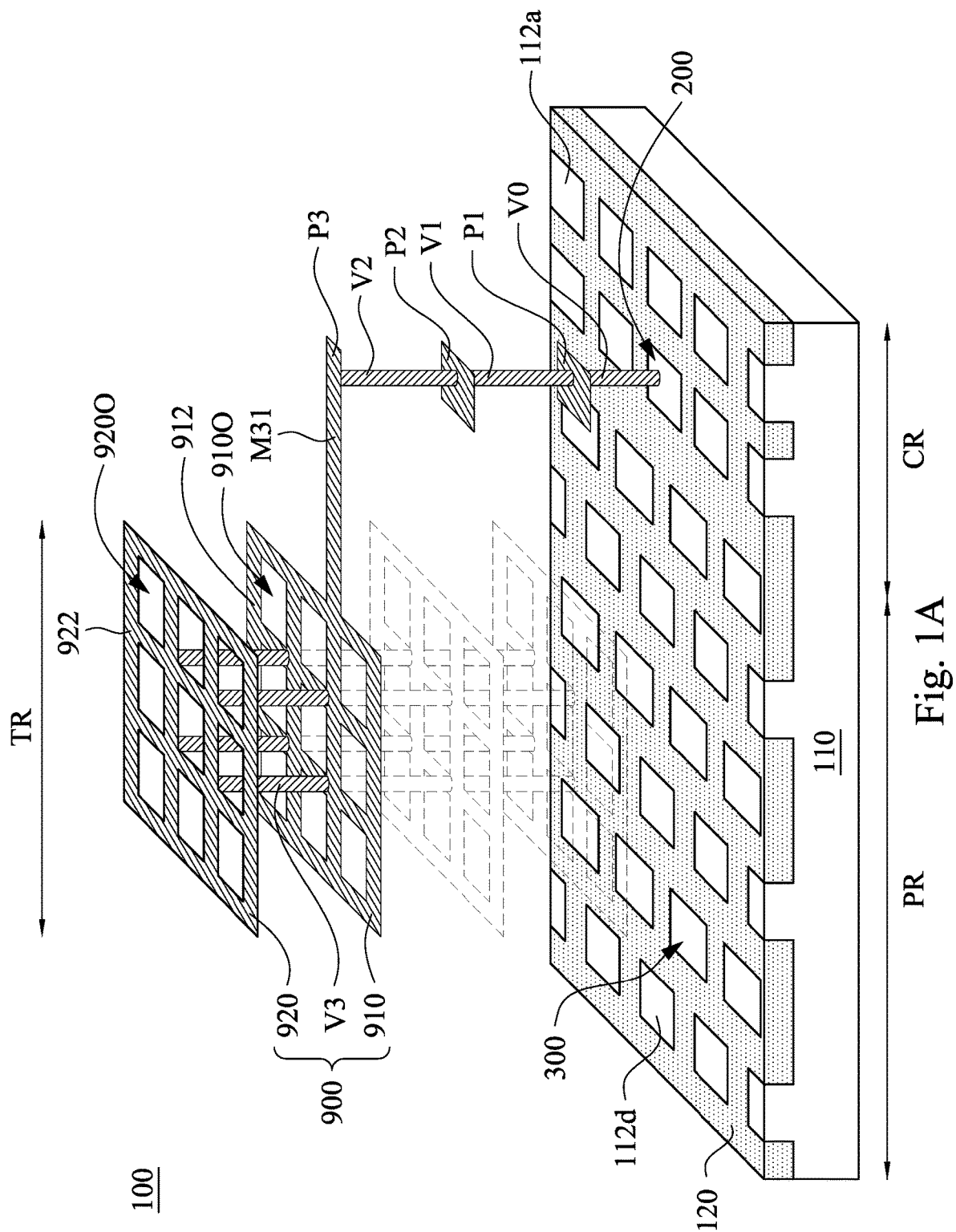
FIG. 1A is a schematic view of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view of a semiconductor structure 100 according to some embodiments of the present disclosure. A semiconductor substrate 110 is provided. and an isolation material 120 is formed to define active regions in the substrate 110. For example, FIG. 1A shows active regions 112a on which devices 200 are formed, and dummy active regions 112d on which dummy devices 300 are formed. The isolation material 120 electrically isolates two neighboring active regions 112a from each other and two neighboring dummy active regions 112d from each other. For clear illustration, the semiconductor substrate 110 is illustrated with a circuit region CR and a peripheral region PR on which devices 200 and dummy devices 300 are formed respectively.

The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

The isolation material 120 may be formed within and/or upon semiconductor substrate 110 by employing methods including but not limited to isolation region thermal growth methods and isolation region deposition/patterning methods. In some embodiments, the isolation material 120 may include a shallow trench isolation (STI) structure, a local oxidation of silicon (LOCOS) structure, other isolation structure, or any combination thereof. In some embodiments, the isolation material 120 is formed, for example, by an STI process, a LOCOS process, or combinations thereof. In some embodiments where the isolation material 120 is formed using STI processes, the formation method includes the steps of etching trenches, and filling the trenches with a filling dielectric material. The filling dielectric material may be silicon oxide, for example.

The devices 200 may be in the form of transistors, resistors, capacitors, inductors, diodes, circuits, or the like. In some embodiments, the devices 200 form a static random access memory (SRAM) circuit, an embedded SRAM circuit, dynamic random access memory (DRAM) circuit, an embedded DRAM circuit, a non-volatile memory circuit, e.g., FLASH, EPROM, E2PROME, a field-programmable gate circuit, a digital logic circuit, an analog circuit, a mixed signal circuit, or other circuit. In some embodiments, the circuit region CR includes substantially all functional devices, transistors, and circuits of an integrated circuit.

In some embodiments, a test structure 900 is formed over a portion of the peripheral region PR, which is referred to as a test region TR herein. The test structure 900 includes at least one metal pattern electrically connected with one of the devices 200. For example, the test structure 900 may include plural metal patterns 910, 920 and via plugs V3 connected between the metal patterns 910 and 920. The metal patterns 910 includes plural metal lines 912 and openings 9100 therebetween. The metal patterns 920 includes plural metal lines 922 and openings 9200 therebetween. In some embodiments, the via plugs V3 may connect an intersecting point of the metal lines 912 to an intersecting point of the metal lines 922.

Figure 1B:
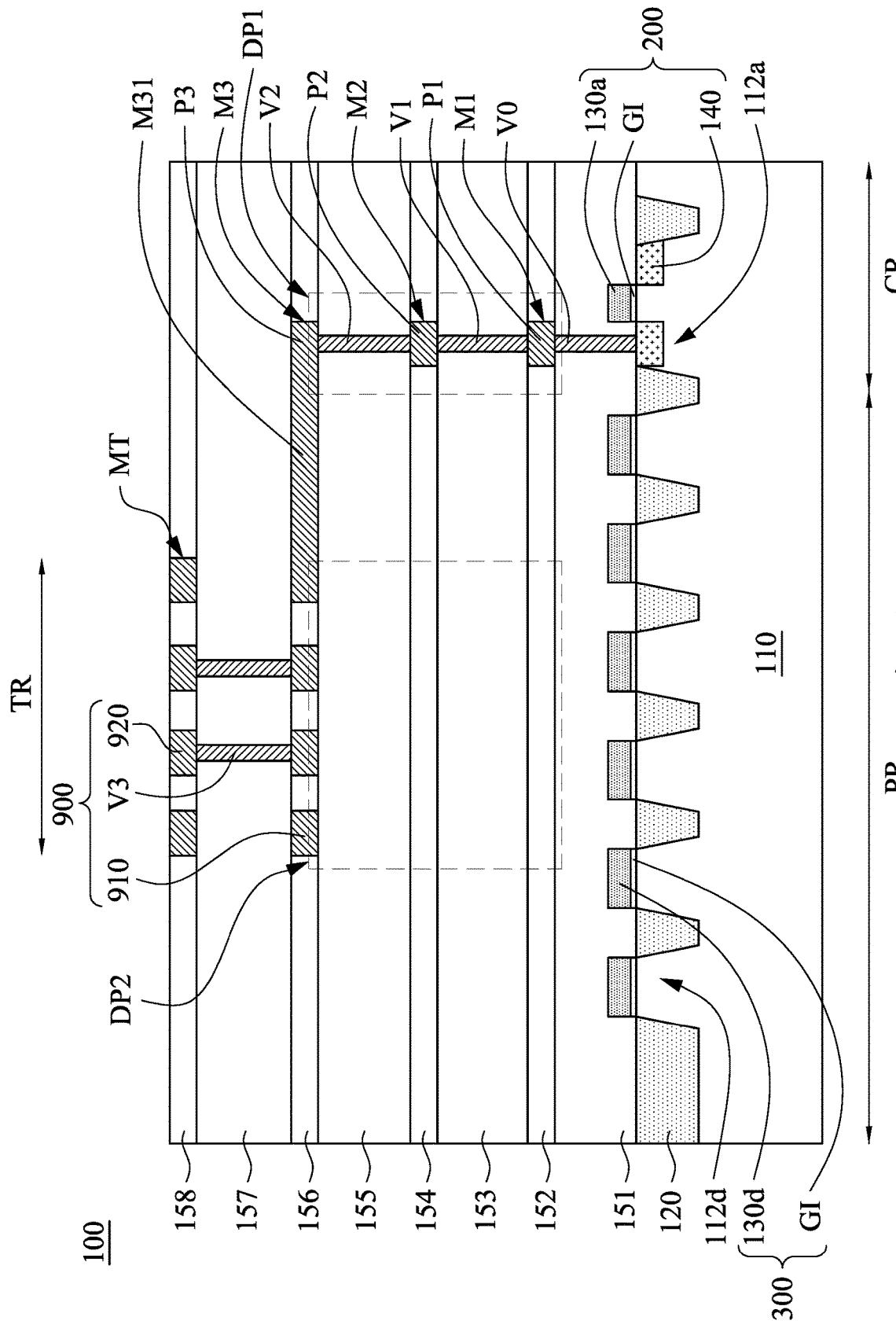
FIG. 1B is a cross-schematic view of the semiconductor structure of FIG. 1A.

FIG. 1B is a cross-schematic view of the semiconductor structure 100 of FIG. 1A. In some embodiments, each of the devices 200 includes a gate electrodes 130a, and each of the dummy devices 300 includes a dummy gate electrodes 130d. The gate electrodes 130a and the dummy gate electrodes 130d include one or more materials including polysilicon, Ti, TiN, TaN, Ta, TaC, TaSiN, W, WN, MoN, MoON, RuO$_2$, and/or other suitable conductive materials. The gate electrodes 130a and the dummy gate electrodes 130d may include one or more layers formed by physical vapor deposition (PVD), CVD, ALD, plating, and/or other suitable processes. The deposition layer is defined by, e.g., photolithographic process and/or etch process for forming the gate electrodes 130a and the dummy gate electrodes 130d.

In some embodiments, the gate electrodes 130a and the dummy gate electrodes 130d further include a work function metal layer, thereby providing an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, each of the devices 200 and the dummy devices 300 includes at least one gate dielectric GI between the active regions 112a/112d and the gate electrodes 130a/130d, respectively. The gate dielectric GI includes a single layer or a multi-layer structure. In some embodiments where the gate dielectric GI includes a multi-layer structure, the gate dielectric GI includes an interfacial dielectric layer and a high-k dielectric layer. The interfacial dielectric layer may include a material such as silicon oxide, silicon nitride, silicon oxynitride, other gate dielectric materials, and/or combinations thereof. The interfacial dielectric layer is formed, in one or more embodiments, by thermal processes, CVD processes, ALD processes, epitaxial processes, and/or combinations thereof. The high-k dielectric layer is formed, in some embodiments, over the interfacial layer. The high-k dielectric layer includes high-k dielectric materials such as HfO$_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer may be formed by any suitable process, such as ALD, CVD, PVD, RPCVD, PECVD, MOCVD, sputtering, plating, other suitable processes, and/or combinations thereof.

In some embodiments, source/drain regions 140 are formed in the active regions 112a. The source/drain regions 140 may be formed through processes such as ion implantation, thermal diffusion, epitaxial growth, and/or other suitable processes. In some embodiments where the source/drain regions 140 are formed through ion implantation, the source/drain regions 140 may be N-type source/drain regions or p-type source/drain regions. The n-type source/drain regions have dopants such as Arsenic (As), Phosphorus (P), other group V element, or the combinations thereof. The p-type source/drain regions have dopants such as Boron (B) or other group III element. In some embodiments, a thermal process and/or rapid thermal process (RTP) is/are performed after the ion implantation processes. In some embodiments where the source/drain regions 140 are formed through epitaxial growth, a recess may be etched in the substrate 210 at one or more of the source/drain regions. The recess may be etched using suitable etching technology such as dry etching, plasma etching, wet etching, and the like. In some embodiments, the source/drain regions include epitaxial regions formed on and/or above the substrate. In some further embodiments, the epitaxial region may be formed in the etched recess of the substrate 210. In some other embodiments, the formation process of the source/drain regions 140 may also form dummy implantation or epitaxial regions in the dummy active regions 112d.

In some embodiments, the semiconductor structure 100 includes plural dielectric layers 151-158 formed over the devices 200 and the dummy devices 300. The dielectric layers 151-158 may be formed of low-k dielectric materials with dielectric constants (k values) between about 2.9 and 3.8, ultra low-k (ULK) dielectric materials with k values between about 2.5 and about 2.9, oxide, undoped silicate glass (USG), silicon dioxide (SiO$_2$), fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The substrate 110 may also include other active and passive devices, for example, underlying the dielectric layers 151-158. These further components are omitted from the figures for clarity.

Plural stacked metallization layers and via layers are formed and embedded in the dielectric layers 151-158. In some embodiments, the plural metallization layers include a top-most metal layer MT, a bottom-most metal layer M1, and other metal layers M2-M3 therebetween. Vertical columnar vias V1-V3 interconnect every two metal layers M1-MT.

In the circuit region CR, the plural stacked metal features and via layers provide interconnections between devices, circuits and inputs/outputs. For example, a contact via V0 in the dielectric layer 151 is landing and connected to an electrode of the device 200 (e.g., the source/drain region 140 or the gate electrode 130a). The metal layers M1-M3 respectively includes metal pads P1-P3 over the device 200, and the vias V1-V2 connects the metal pads P1-P3 to each other. In the present embodiments, the metal pad P1 is connected to the contact via V0, such that the metal pad P3 is electrically connected to the electrode of the device 200.

The plural stacked metal features and via layers form a test structure 900 in the test region TR of the peripheral region PR. For example, the metal layers M3 and MT respectively includes metal patterns 910 and 920, which form the test structure 900 with the via V3. The stacked metal features and via layers in the dielectric layers 151-158 may not provide interconnections to the dummy devices.

The metal layer M3 further includes a metal line M31 connecting the metal pattern 910 to the metal pad P3. To be specific, the metal line M31 extends from the test region TR, through a portion of the peripheral region PR other than the test region TR, and enters the circuit region CR. Through the metal line M3I, the metal pads P1-P3, and vertical columnar vias V0-V2, the test structure 900 is electrically connected the device 200. In the present embodiments, the metal line extending from the test region to the circuit region (e.g., the metal line M31) is formed in the same metal layer with a bottom-most metal pattern of the test structure 900 (e.g., the metal pattern 910). However, it should not limit the scope of the present disclosure. In some other embodiments, the metal line extending from the test region to the circuit region may be formed with other metal pattern of the test structure 900. For example, the metal line may be formed with the metal pattern 920 in some other embodiments.

In some embodiments of the present disclosure, the test structure 900 does not include a metal feature of the metal layer Ml. For example, the metal layer M1 does not include a metal feature connected to the test structure 900 in the test region TR. Such configuration of the test structure 900 allows a high test voltage, since the test voltage would not be limited by the metal layer M1 to OD/PO breakdown voltage. In the present embodiments, the test structure 900 does not include a metal feature of the metal layers M1 and M2, such that the test voltage would not be limited by the metal layer M2 to OD/PO breakdown voltage, and a higher test voltage is allowed. In some embodiments, the dielectric layers 152-155 fills between the dielectric layer 151 and the test structure 900. That is, the metal layers below the test structure 900 (e.g., the metal layers M1 and M2) do not include a metal feature in the test region TR. Through the configuration, the high voltage test would not lead to breakdown between the test structure 900 and the metal layer M1 and M2.

In other words, at least one of the dielectric layers 152-155 and the metallization pattern therein forms a metal/dielectric layer, in which the metal/dielectric layer has a metal/dielectric region DP1 and a dielectric region DP2 adjacent to the metal/dielectric region DP1, which are indicated by dashed lines in FIG. 1B. The metal/dielectric region DP1 has a metallization pattern connected to the device 200. For example, the metallization pattern includes at least one of the metal pads M1, M2 and the vias V1, V2. The test structure 900 is formed over the dielectric region DP2, which is void of metal. For example, the dielectric material of dielectric region DP2 covers the entire test region TR and fills between the dielectric layer 151 and the test structure 900. Through the configuration, the substrate 110 and the test structure 900 are spaced apart from each other by the dielectric region DP2. In some embodiments, the dielectric region DP2 may be designed to be thick enough to withstand a high test voltage. For example, the dielectric region DP2 includes plural dielectric layers 152-155 in the test region TR. In some other embodiments, the dielectric region DP2 may include some of the dielectric layers 152-155.

The metal/dielectric region DP1 and the dielectric region DP2 of the metal/dielectric layer are respectively in the circuit region CR and the test region TR. In some embodiments, the dielectric region DP2 of the metal/dielectric layer may also be in a portion of the peripheral region PR other than the test region TR. In some other embodiments, the metal/dielectric portion DP1 of the metal/dielectric layer may also be in a portion of the peripheral region PR other than the test region TR.

The metallization layers and via layers may include aluminum, aluminum alloy, copper, copper alloy, titanium, titanium nitride, tantalum, tantalum nitride, tungsten, metal silicide, or combinations thereof. Formation of the metal layers M1-MT, the vertical columnar vias V0-V3, and the dielectric layers 151-158 may be achieved by a dual-damascene process and/or a single-damascene process. In the single-damascene process, grooves are formed in a dielectric layer (e.g., the dielectric layers 151-158) and filled with metal to form conductive lines. Dual damascene takes the process one step further in that, in addition to forming the grooves of a single damascene, conductive openings are also formed in the dielectric layer (e.g., the dielectric layers 151-158). The resulting composite structure of grooves and holes are filled with metal. The process is repeated as many times as required to form the multi-level interconnections (e.g., the metal layers M1-MT and vias V0-V3).

Exemplary formation of the semiconductor structure may include forming isolation material 120 on the semiconductor substrate 110; forming devices 200 and dummy devices 300 on the active regions 112a and the dummy active regions 112d; forming a dielectric layer 151 over the devices 200 and dummy devices 300; forming a contact via V0 connected to the devices 200 in the dielectric layer 151; forming metal/dielectric layers with a metallization pattern connected to the device 200, in which the metallization pattern is not present in a region of the metal/dielectric layers (e.g., the dielectric region DP2); and forming aforementioned test structure 900 over the region of the metal/dielectric layers.

In the present embodiments, the device 200 is a transistor, and the test structure 900 is connected to the source/drain region 140 or the gate electrode 130a. During the testing, high voltages may be applied on to the device 200 through the test structure 900, and a current or voltage on the other electrode of the device 200 (e.g., another source/drain region 140) is detected for obtaining device parameters. In some embodiments, the device 200 may be in the form of resistors, capacitors, inductors, diodes, or the like. The device parameters may be MOSFET threshold voltage (Vt), contact/via chain resistance, sheet capacitance, gate oxide breakdown voltage, and the like. By studying these parameters, it is possible to monitor, improve and refine a semiconductor production process.

In some embodiments of the present disclosure, the test structure 900 is away from the top of the device 200, and spaced apart from the dummy device 300 by a thick dielectric layer (e.g., the dielectric region DP2 of the metal/dielectric layer in present embodiments) without vias or metal pads therein. For example, there are no vias or metal pads between the test structure 900 and the dummy active region 112d/the dummy gate electrode 130d. Through the configuration, when a high voltage test or a TDDB (time-dependent dielectric breakdown) test is performed, the thick dielectric layer (e.g., the dielectric region DP2 of the metal/dielectric layer) may withstand a high voltage that applied onto the test structure 900, and therefore the test voltage would not be limited to a breakdown voltage between the first metal layer M1 to source/drain region 140 or the gate electrode 130a. As such, an ultra-high voltage testing (>500V) will be allowed.

Figure 2:
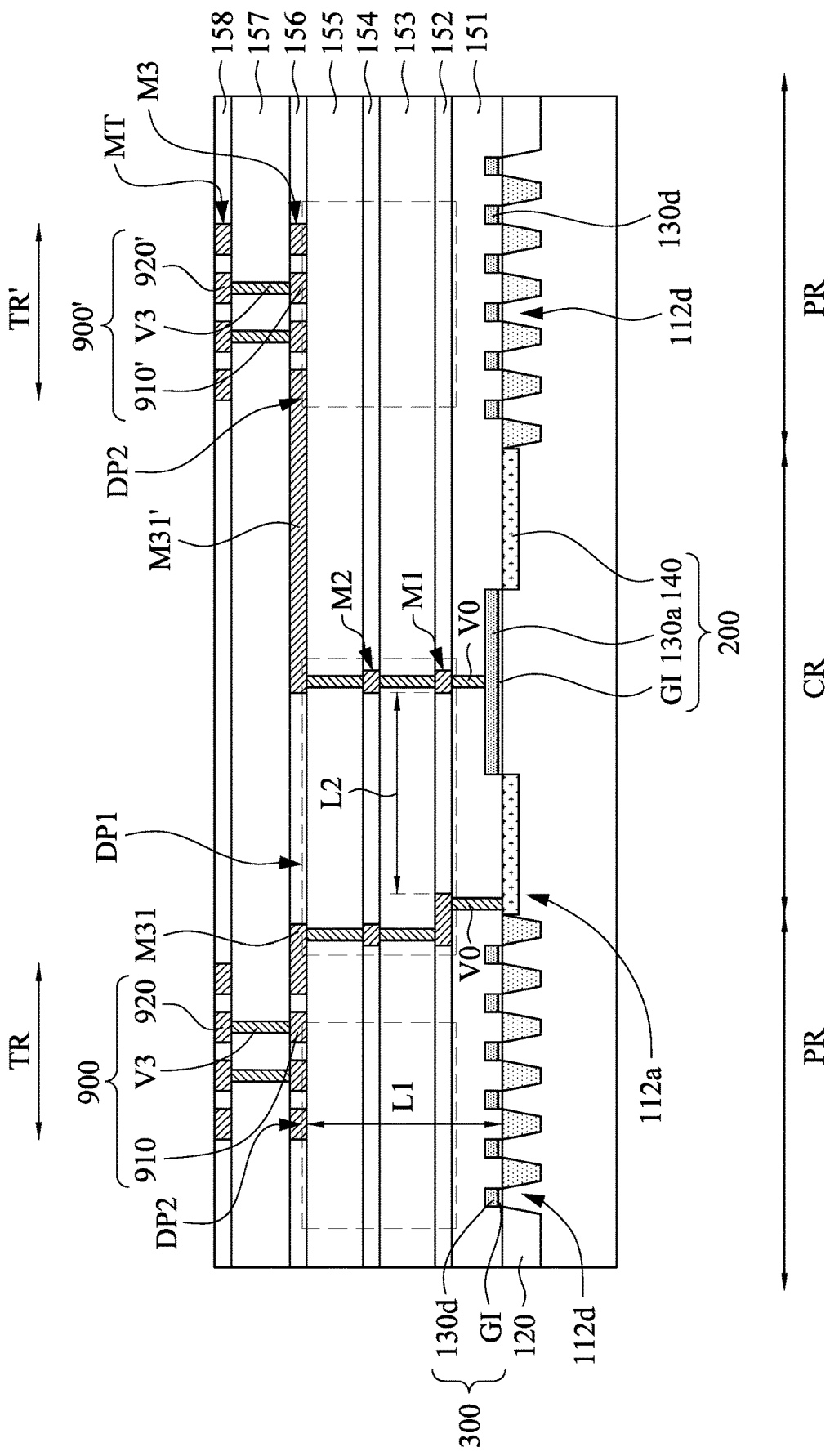
FIG. 2 is a schematic view of a semiconductor structure according to some embodiments of the present disclosure.

FIG. 2 is a schematic view of a semiconductor structure according to some embodiments of the present disclosure. Another test structure 900' is provided in another test region TR' of the peripheral region PR of the substrate 110. The test structure 900' includes metal patterns 910' and 920' of the metal layers M3 and MT, respectively, and via plugs V3 connected between the metal patterns 910' and 920'. As the configuration of the test structure 900, the test structure 900' does not include a metal feature of metal layers M1 and M2. The test structures 900 and 900' are electrically connected to the source/drain region 140 and the gate electrode 130a of the device 200, through the metal lines M31 and M31' of the metal layer M3, respectively. Through the configuration, the device 200 can be tested through the test structures 900 and 900'. For example, a voltage is applied onto the gate electrode 130a through the test structure 900', and a drain current may be measured from the test structure 900. In some embodiments, a distance L2 between a metallization pattern connected to the gate electrode 130a and a metallization pattern connected to the source/drain region 140 is greater than a distance L1 between the test structure 900 and the dummy active regions 112d, thereby preventing a breakdown between the metallization pattern connected to the gate electrode 130a and the metallization pattern connected to the source/drain region 140 during the high voltage test. Other details of the present embodiments are similar to those aforementioned, and not repeated herein.

Figure 3:
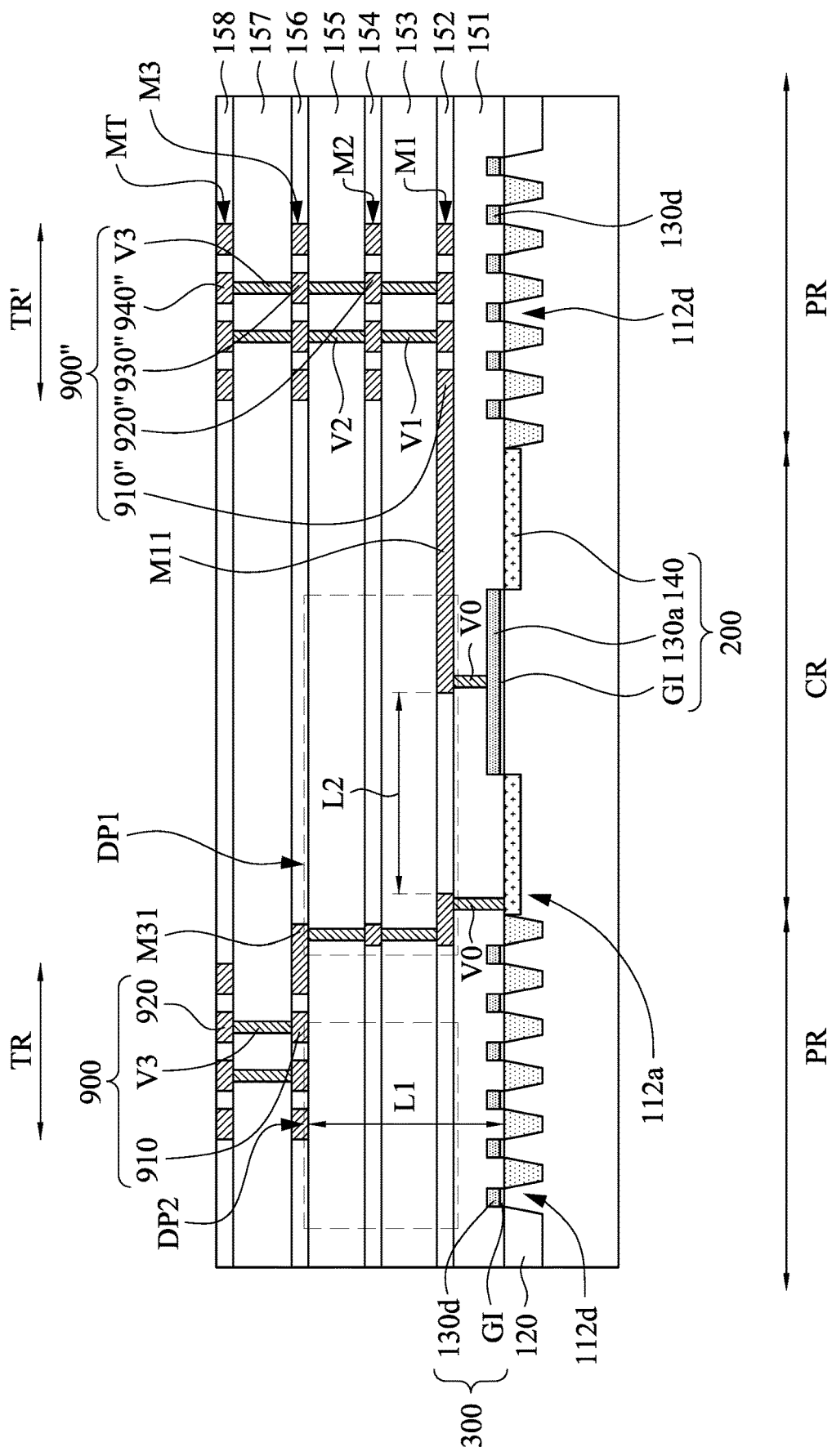
FIG. 3 is a schematic view of a semiconductor structure according to some embodiments of the present disclosure.

FIG. 3 is a schematic view of a semiconductor structure according to some embodiments of the present disclosure. Another test structure 900" is provided in another test region TR" of the peripheral region PR of the substrate 110. The test structure 900" includes metal patterns 910"-940" of the metal layers M1-MT, and via plugs V1-V3 connected between the metal patterns 910"-940". The test structures 900 and 900" are electrically connected to the source/drain region 140 and the gate electrode 130a of the device 200, through the metal lines M31 and M11 of different metal layers (e.g., the metal layers M3 and M1), respectively. Through the configuration, the device 200 can be tested through the test structures 900 and 900". For example, a voltage is applied onto the gate electrode 130a through the test structure 900", and a drain current may be measured from the test structure 900. Other details of the present embodiments are similar to those aforementioned, and not repeated herein.

Figure 4A:
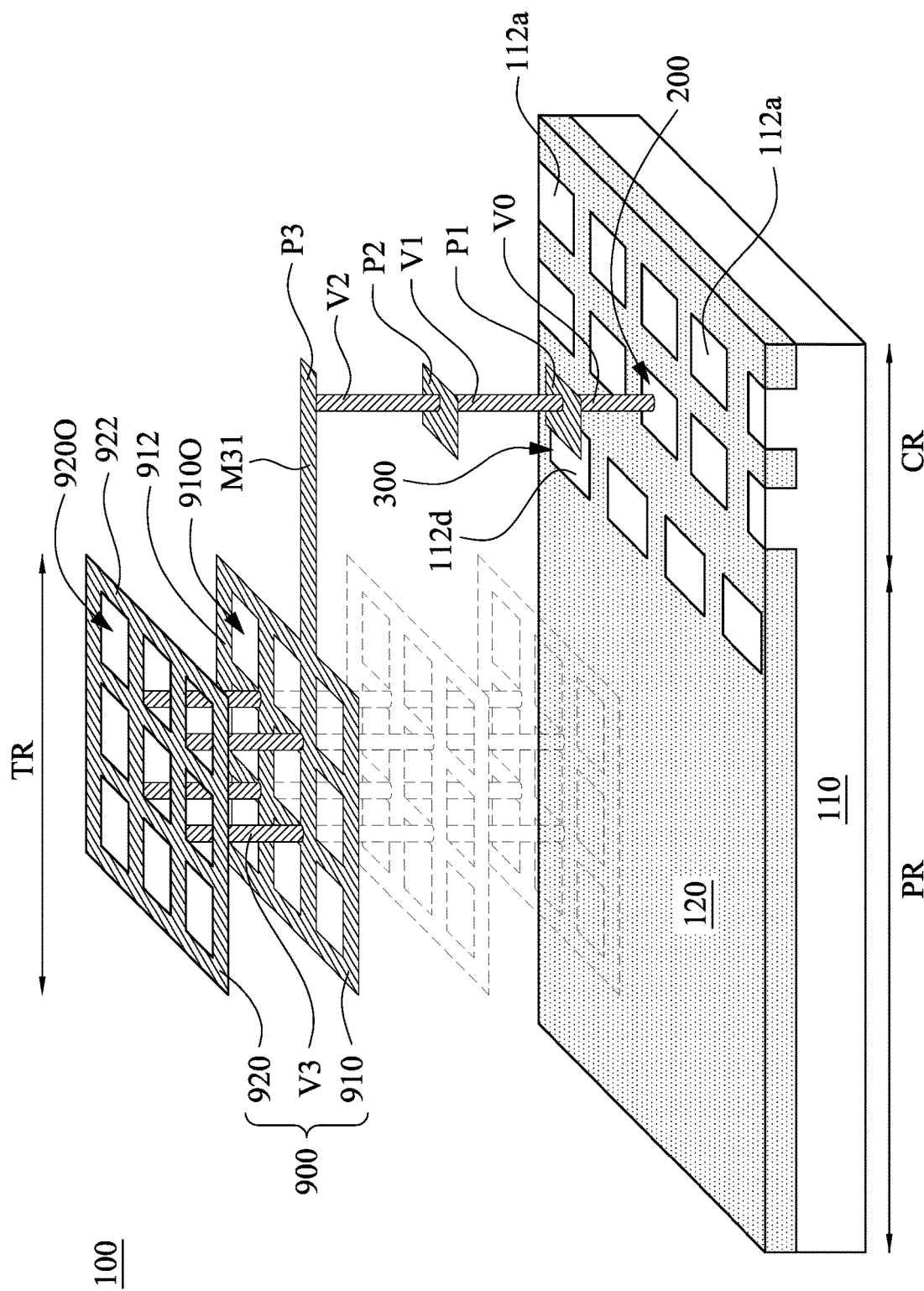
FIG. 4A is a schematic view of a semiconductor structure according to some embodiments of the present disclosure.

FIG. 4A is a schematic view of a semiconductor structure according to some embodiments of the present disclosure. FIG. 4B is a cross-schematic view of the semiconductor structure of FIG. 4A. The present embodiments are similar to the embodiments of FIG. 1A and FIG. 1B, and the difference between the present embodiments and the embodiments of FIG. 1A and FIG. 1B is that the test structure 900 is over the isolation material 120. To be specific, in the present embodiments, the isolation material 120 covers the test region TR, such that the metal lines 912 and 922 and openings 910O and 920O of the test structure 900 are not over an active region of the substrate 110, but over the isolation material 120. Through the configuration, when a high voltage test or a TDDB (time-dependent dielectric breakdown) test is performed, the thick dielectric layer (e.g., the dielectric region DP2), the dielectric layer 151, and the isolation material 120 may withstand a high voltage that applied onto the test structure 900, and therefore an ultra-high voltage testing (>500V) will be allowed.

In the present embodiments, the isolation material 120 further surrounds dummy active regions 112d of the substrate 110 in the peripheral region PR other than the test region. In some other embodiments, the isolation material 120 may cover the entire peripheral region PR, and the dummy active regions 112d are omitted. Other details of the present embodiments are similar to those aforementioned, and not repeated herein.

Figure 5A:
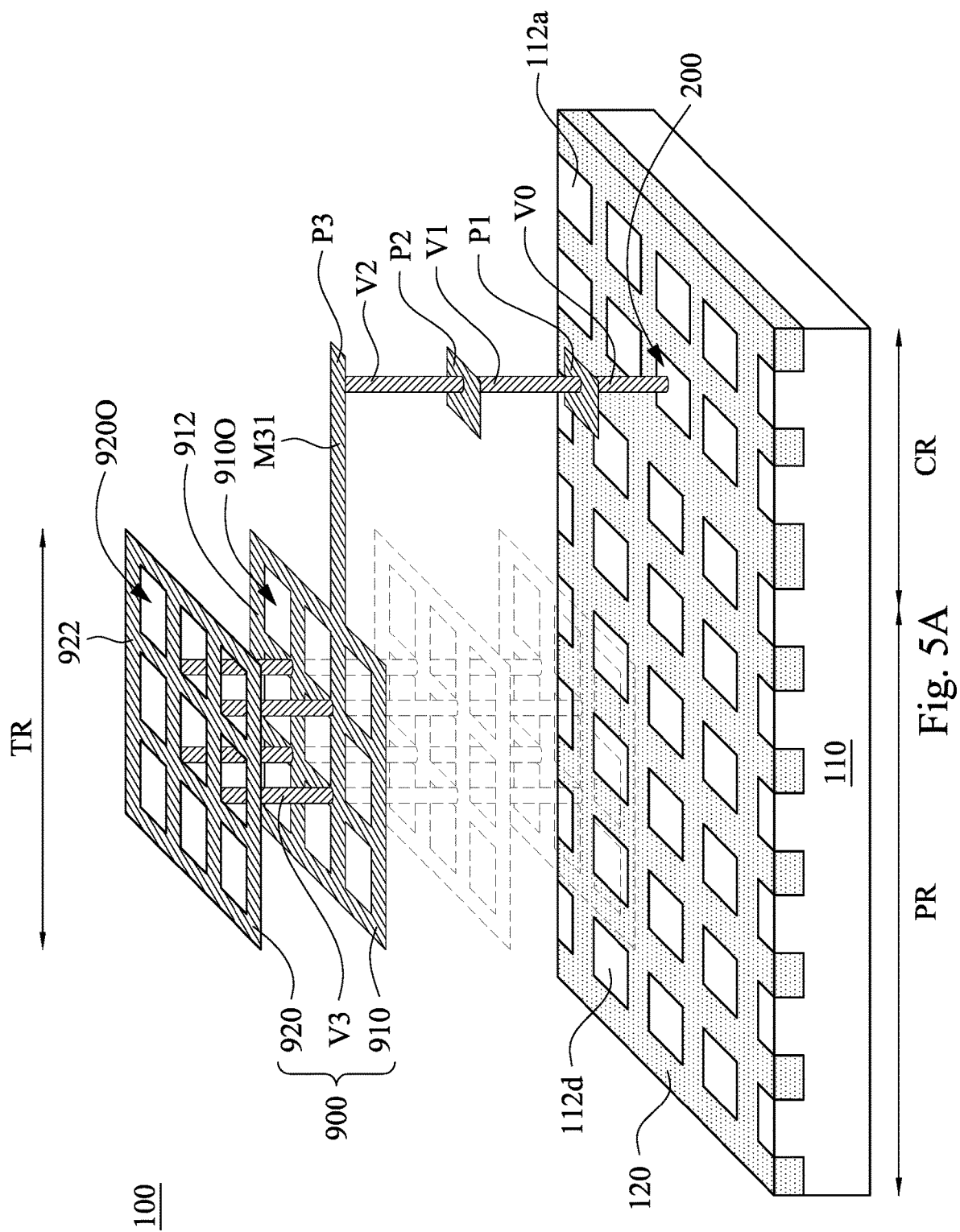
FIG. 5A is a schematic view of a semiconductor structure according to some embodiments of the present disclosure.
Figure 5B:
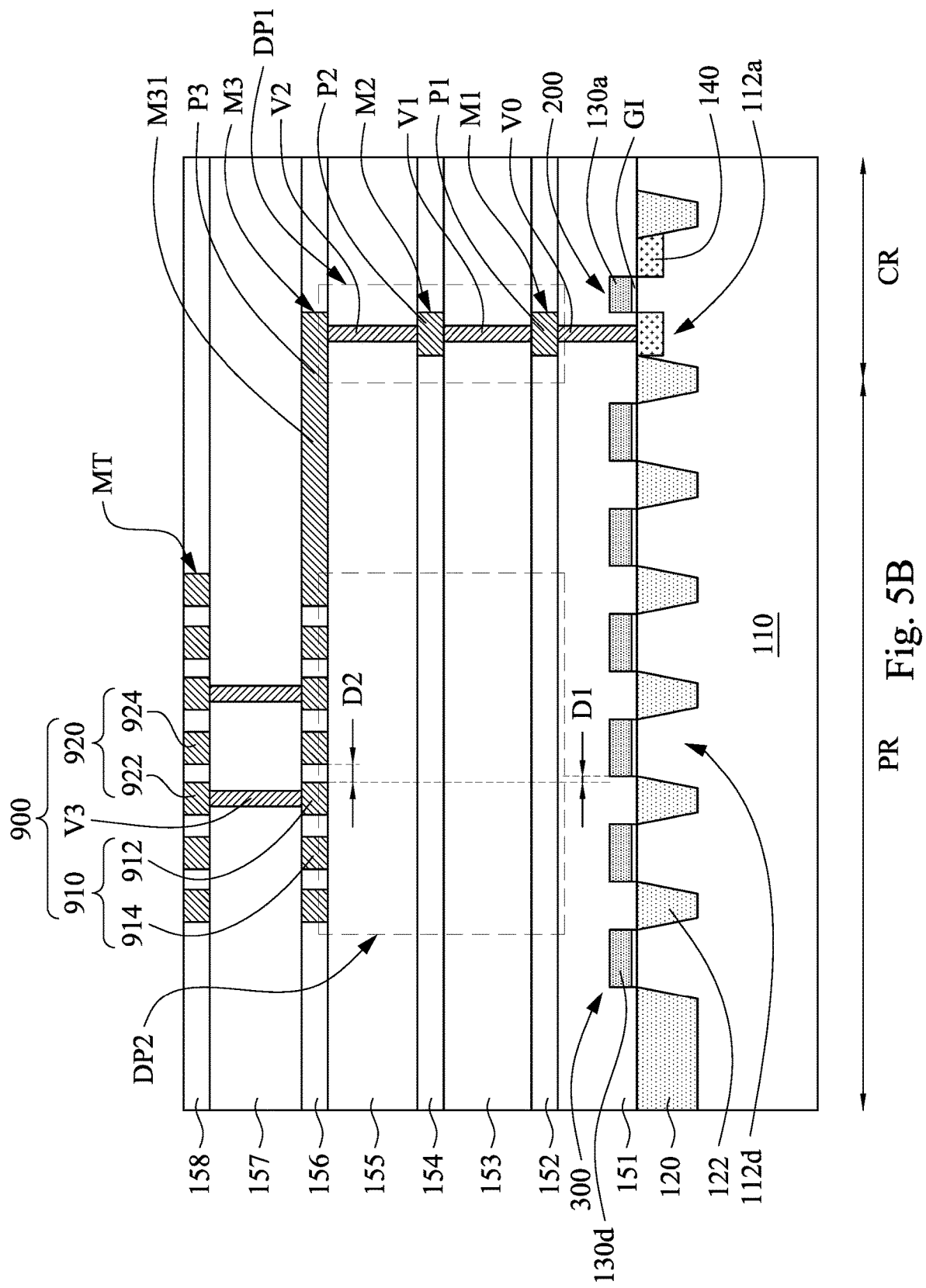
FIG. 5B is a cross-schematic view of the semiconductor structure of FIG. 5A.
Figure 5C:
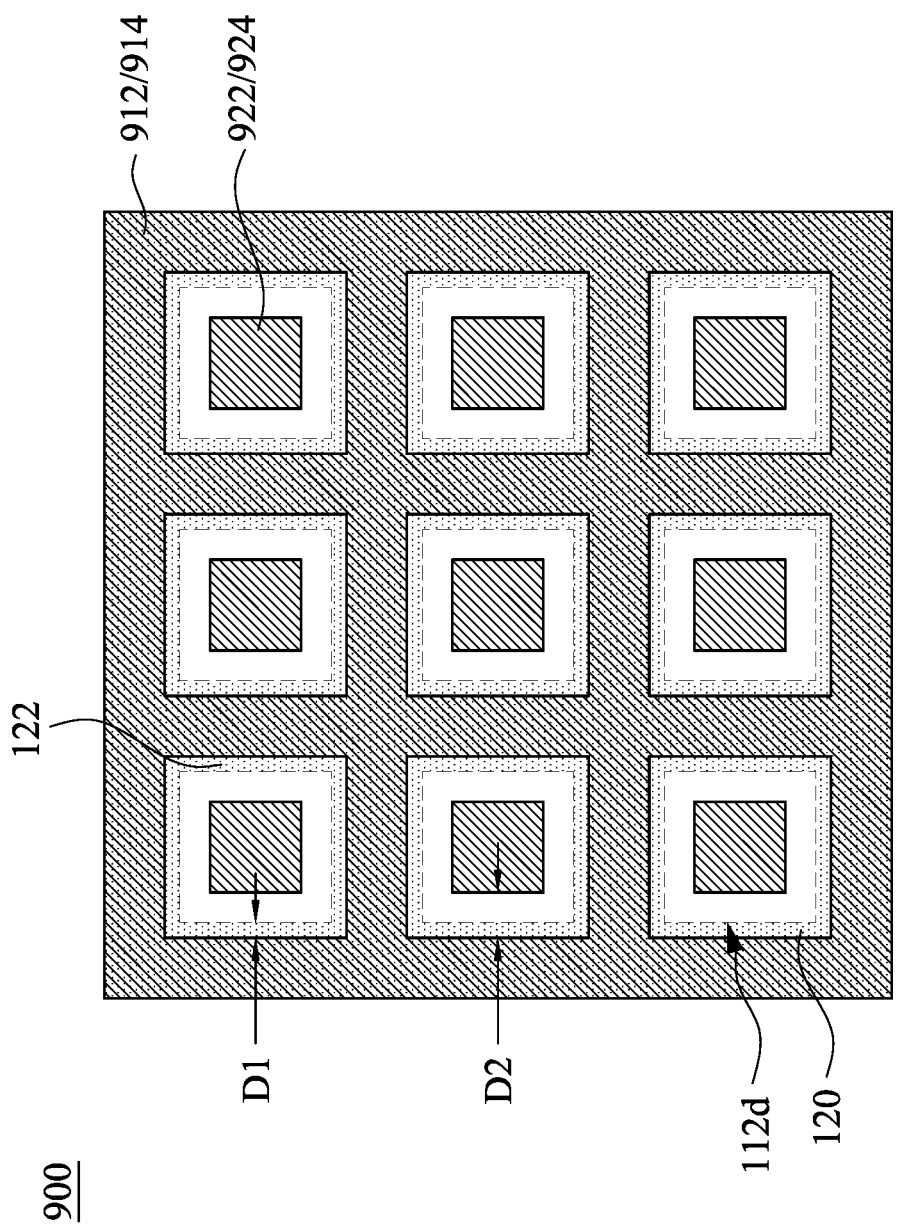
FIG. 5C is a top view of the semiconductor structure of FIG. 5A.

FIG. 5A is a schematic view of a semiconductor structure according to some embodiments of the present disclosure. FIG. 5B is a cross-schematic view of the semiconductor structure of FIG. 5A. FIG. 5C is a top view of the semiconductor structure of FIG. 5A. The present embodiments are similar to the embodiments of FIG. 1A and FIG. 1B, and the difference between the present embodiments and the embodiments of FIG. 1A and FIG. 1B is that the metal lines 912 and 922 of the test structure 900 are over the isolation material 120, but not over the dummy active region 112d or the dummy gate electrodes 130d. That is, the metal lines 912 and 922 are vertically aligned with the isolation material 120.

To be specific, referring to FIGS. 5B and 5C, a projection of the metal lines 912 and 922 over the substrate 110 overlapped with the isolation material 120, but not overlapped with the dummy active region 112d. For example, the projection of the metal lines 912 and 922 on the substrate 110 is spaced apart from the dummy active regions 112d by a distance D1. In some embodiments, every two adjacent dummy active regions 112d are separated from each other by portions 122 of the isolation material 120. Some of the metal lines 912/914 is vertically aligned with the portions 122 of the isolation material 120. Through the configuration, when a high voltage test or a TDDB (time-dependent dielectric breakdown) test is performed, the thick dielectric layer (e.g., the dielectric layers 151-155 or the dielectric region DP2) and the isolation material 120 may withstand a high voltage that applied onto the test structure 900, and therefore an ultra-high voltage testing (>500V) will be allowed.

In some embodiments, the metal patterns 910 and 920 may further include dummy pads 914 and 924 over the dummy active regions 112d, respectively. The dummy pads 914 and 924 are electrically isolated from the metal lines 912 and 922. For example, portions of the dielectric layer 156 are between the dummy pads 914 and the metal lines 912, and portions of the dielectric layer 158 are between the dummy pads 924 and the metal lines 922. The metal lines 912 and 922 are separated from the dummy pads 914 and 924 by a distance D2, respectively, and the distance D2 may be equal to or greater than the distance D1. The configuration of the dummy pads 914 and 924 improves pattern uniformity during forming the metal lines 912 and 922.

Figure 6:
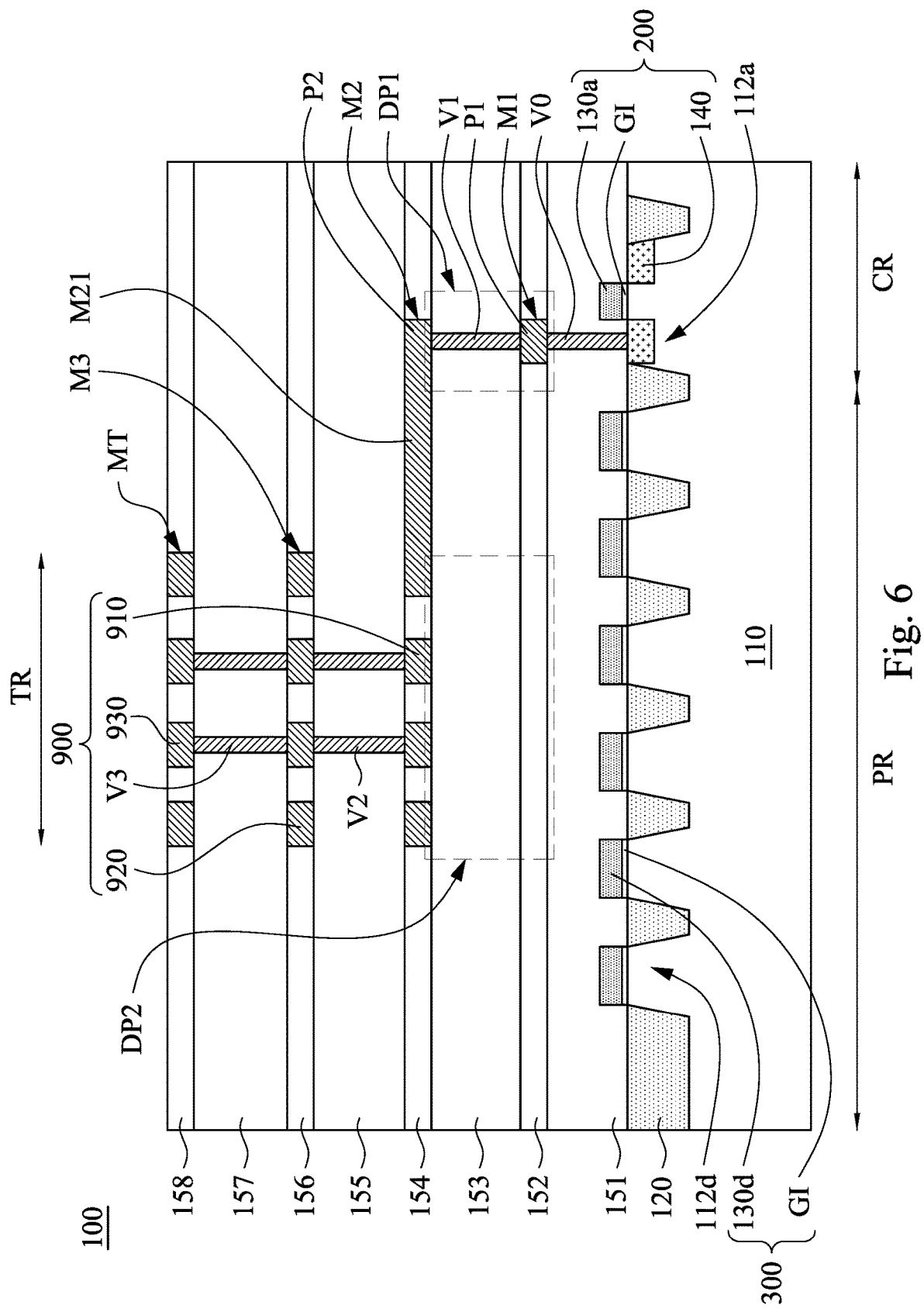
FIG. 6 is a cross-schematic view of a semiconductor structure according to some embodiments of the present disclosure.

FIG. 6 is a cross-schematic view of a semiconductor structure according to some embodiments of the present disclosure. The present embodiments are similar to the embodiments of FIGS. 1A and FIG. 1B, and the difference between the present embodiments and the embodiments of FIG. 1A and FIG. 1B is that the test structure 900 includes metal patterns 910-930 of the metal layers M2-MT respectively, and via plugs V2-V3 connected between the metal patterns 910-930. The metal layer M2 further includes a metal line M21 connects a bottom-most metal pattern of the test structure 900 (e.g., the metal pattern 910) to the metal pad P2, in which the metal line M21 extends from the test region TR, through a portion of the peripheral region PR, to the circuit region CR. The dielectric region DP2 of the metal/dielectric layer in the present embodiments includes the dielectric layers 152-153 in the test region TR. The dielectric layers 152-153 fills between the test structure 900 and the dielectric layer 151 in the test region TR. Through the configuration, a voltage for testing the device would not be limited by the first metal layer to OD/PO breakdown voltage, and therefore a high voltage test is allowed. Other details of the present embodiments are similar to those aforementioned, and not repeated herein.

FIG. 7 is a flow chart of a method M for manufacturing an integrated circuit according to some embodiments of the present disclosure. The method M begins with the block B1, where a wafer having a test structure are fabricated. During the fabrication, plural dies are formed on a substrate and separated from each other by scribe line, and the test structure may be formed in suitable areas in the die.

The method M proceeds to a block B2, where a probe test using the test structure is performed. The semiconductor chips are tested after they are completed. This testing may take a number of forms. Wafer acceptance testing (WAT) involves using process control monitors to conduct a number of tests using statistical methods to analyze the success of the wafer fabrication process and attempt to determine the cause of any fabrication deficiencies. Another test referred to as a circuit probe (CP) test involves using one or more probes to determine which die are good and which are not. In some embodiments, the CP test is performed at the same time as the WAT. In some other embodiments, the WAT and the CP test are performed in sequence instead of simultaneously. In some other embodiments, one of the WAT and the CP test is performed.

After testing, the method M proceeds to a block B3, where the dices are singulated into individual chips. This is may be achieved by using a laser cutting tool or an etching process. Each die identified as a good die in the testing process is packaged (as shown in block B4) for individual use. Note that the steps of method M may be performed in any logically-permissible order unless explicitly recited otherwise in a claim, and other operations may be inserted in the sequence of method M without departing from the spirit of the invention.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a voltage for testing the device would not be limited by the first metal layer to OD/PO breakdown voltage, and therefore a high voltage test is allowed. Another advantage is that metal lines of the test structure may be aligned with isolation features, such that the metal lines may not be vertically overlap with oxide defined region or gate electrode, which in turn will allow higher test voltage. Still another advantage is that dummy metal pads are inserted between metal lines of the test structure for improving pattern uniformity.

According to some embodiments of the present disclosure, a semiconductor structure includes a substrate, a device, a contact via, a metal/dielectric layer, and a test structure. The device is over the substrate. The contact via is over the substrate and connected to the device. The metal/dielectric layer is over the contact via. The metal/dielectric layer includes a first portion and a second portion. The first portion of the metal/dielectric layer has a metallization pattern connected to the contact via. The second portion of the metal/dielectric layer is void of metal. The test structure is over the second portion of the metal/dielectric layer.

According to some embodiments of the present disclosure, a semiconductor structure includes a substrate, a device, a first dielectric layer, a contact via, a test structure, at least one second dielectric layer, a metallization pattern, and. The substrate has a circuit region and a test region adjoining the circuit region. The device is over the circuit region of the substrate. The first dielectric layer is over the device, in which the first dielectric layer has a first portion over the circuit region and a second portion over the test region. The contact via is in the first portion of the first dielectric layer and connected to the device. The test structure is right above the second portion of the first dielectric layer. The at least one second dielectric layer is over the contact via and filling between the test structure and the second portion of the first dielectric layer. The metallization pattern is in the at least one second dielectric layer right over the circuit region and connected to the contact via.

According to some embodiments of the present disclosure, a semiconductor structure includes a substrate, an isolation feature, and a test metal pattern. The substrate has plural dummy active regions. The isolation feature is over the substrate, and every two adjacent ones of the dummy active regions are separated from each other by a portion of the isolation feature. The test metal pattern includes plural test metal lines over the isolation feature, in which at least one of the test metal lines is vertically aligned with the portion of the isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a device over the substrate;
   a contact via disposed over the substrate and connected to the device;
   an interconnect structure over the contact via, wherein the interconnect structure comprises:
   a first region having a metallization pattern connected to the contact via; and
   a second region void of metal, wherein a bottom surface of the second region is higher than a top surface of the contact via; and
   a test structure over the second region of the interconnect structure, wherein the test structure comprises a bottom test metal pattern, and the bottom test metal pattern has a plurality of test metal lines extending over and in contact with a top surface of the second region of the interconnect structure.

2. The semiconductor structure of claim 1, further comprising:
   a metal line over the interconnect structure, wherein the metal line electrically connects the test metal lines of the bottom test metal pattern of the test structure to the metallization pattern.

3. The semiconductor structure of claim 2, wherein the metal line continuously extends from the first region of the interconnect structure to the second region of the interconnect structure.

4. The semiconductor structure of claim 1, wherein the test structure further comprises a top test metal pattern and at least one test via connecting the top test metal pattern to the bottom test metal pattern.

5. The semiconductor structure of claim 1, wherein the test metal lines of the bottom test metal pattern are connected with each other.

6. The semiconductor structure of claim 1, wherein the contact via is connected to a gate electrode or a source/drain region of the device.

7. The semiconductor structure of claim 1, further comprising:
a dielectric layer between the interconnect structure and the device, wherein the contact via is in the dielectric layer.

8. The semiconductor structure of claim 1, wherein the bottom test metal pattern comprises a plurality of metal dummy pads surrounded by the test metal lines and separated from the test metal lines, and the metal dummy pads are in contact with the top surface of the second region of the interconnect structure.

9. A semiconductor structure, comprising:
a substrate having a circuit region and a test region located on one side of the circuit region;
a device right over the circuit region of the substrate;
a first dielectric layer over the device, wherein the first dielectric layer has a first portion over the circuit region and a second portion over the test region;
a contact via in the first portion of the first dielectric layer and connected to the device;
a test structure right above the second portion of the first dielectric layer;
at least one second dielectric layer over the contact via and filling between the test structure and the second portion of the first dielectric layer;
a metallization pattern in the at least one second dielectric layer right over the circuit region and connected to the contact via; and
a metal line over the second dielectric layer, wherein the metal line extends from a bottommost layer of the test structure and connects the test structure to the metallization pattern, and an entire bottom surface of the bottommost layer of the test structure is in direct contact with the second dielectric layer.

10. The semiconductor structure of claim 9, wherein the metallization pattern comprises a plurality of metal features in a plurality of the second dielectric layers.

11. The semiconductor structure of claim 9, further comprising:
an isolation feature covering the test region of the substrate.

12. The semiconductor structure of claim 9, further comprising:
an isolation feature over the test region of the substrate, wherein the substrate has a plurality of dummy active regions, and the dummy active regions are separated from each other by the isolation feature; and
a plurality of dummy devices over the dummy active regions.

13. A semiconductor structure, comprising:
a substrate having a plurality of dummy active regions;
an isolation feature over the substrate, wherein every two adjacent ones of the dummy active regions are separated from each other by a portion of the isolation feature; and
a first test metal pattern comprising a plurality of first test metal lines over the isolation feature, wherein at least one of the first test metal lines has opposite sidewalls directly over the portion of the isolation feature.

14. The semiconductor structure of claim 13, further comprising:
a dummy device over the dummy active regions of the substrate.

15. The semiconductor structure of claim 13, wherein the first test metal pattern further comprises a plurality of metal dummy pads surrounded by the first test metal lines and separated from the first test metal lines.

16. The semiconductor structure of claim 15, wherein the metal dummy pads are directly over the dummy active regions, respectively.

17. The semiconductor structure of claim 13, further comprising:
a device over the substrate, wherein the isolation feature surrounds a plurality of active regions, and the device is over the active regions and electrically connected to the first test metal pattern.

18. The semiconductor structure of claim 13, wherein the first test metal lines are connected with each other.

19. The semiconductor structure of claim 13, further comprising:
a second test metal pattern over the first test metal pattern; and
a test metal via vertically extending from the first test metal pattern to the second test metal pattern.

20. The semiconductor structure of claim 19, wherein the second test metal pattern comprises a plurality of second test metal lines over the isolation feature, wherein at least one of the second test metal lines has opposite sidewalls directly over the portion of the isolation feature.

* * * * *